United States Patent
Kurita et al.

(10) Patent No.: US 7,247,583 B2
(45) Date of Patent: Jul. 24, 2007

(54) MANUFACTURING METHOD FOR STRAINED SILICON WAFER

(75) Inventors: Hisatsugu Kurita, Niigata (JP); Masato Igarashi, Niigata (JP); Takeshi Senda, Niigata (JP); Koji Izunome, Niigata (JP)

(73) Assignee: Toshiba Ceramics Co., Ltd., Tokyo (JP)

(*) Notice: Subject to any disclaimer, the term of this patent is extended or adjusted under 35 U.S.C. 154(b) by 1 day.

(21) Appl. No.: 11/038,180

(22) Filed: Jan. 21, 2005

(65) Prior Publication Data

US 2005/0170664 A1 Aug. 4, 2005

(30) Foreign Application Priority Data

Jan. 30, 2004 (JP) ............................. 2004-024054

(51) Int. Cl.
*H01L 21/31* (2006.01)
*H01L 21/469* (2006.01)
*H01L 21/336* (2006.01)
*H01L 21/8234* (2006.01)

(52) U.S. Cl. ...................... 438/778; 438/197; 438/275

(58) Field of Classification Search ................ 438/778, 438/197, 275, 481, 504
See application file for complete search history.

(56) References Cited

FOREIGN PATENT DOCUMENTS

| | | | |
|---|---|---|---|
| JP | 2582506 | B2 | 11/1996 |
| JP | 2792785 | B2 | 6/1998 |
| JP | 2002-118254 | A | 4/2002 |
| JP | 2002-289533 | * | 4/2002 |
| JP | 2003-197544 | A | 7/2003 |
| JP | 2003-229360 | * | 8/2003 |
| JP | 2003-229360 | A | 8/2003 |
| WO | WO 03/103031 | | 12/2003 |
| WO | WO 03/103031 A2 | * | 12/2003 |

* cited by examiner

*Primary Examiner*—Chuong A. Luu
(74) *Attorney, Agent, or Firm*—Foley & Lardner LLP

(57) ABSTRACT

A method for manufacturing a strained silicon wafer, having steps of a first step of preparing a single crystal silicon substrate, a second step of forming a graded SiGe layer on the substrate, the graded SiGe layer having a first Ge composition ratio increased stepwisely from 5 to 60% at atomic ratio, a third step of forming a SiGe constant composition layer on the graded SiGe layer, the SiGe constant composition layer having a Ge composition ratio substantially equal to the Ge composition ratio on a surface of the-graded SiGe layer and a fourth step of forming a strained Si layer on the SiGe constant composition layer. The second through fourth steps are performed under the reduced pressure atmosphere while the single crystal silicon substrate is rotated in a circumferential direction at a rate from 300 rpm to 1500 rpm.

6 Claims, No Drawings

US 7,247,583 B2

MANUFACTURING METHOD FOR STRAINED SILICON WAFER

The present invention claims foreign priority to Japanese patent application no. 2004-024054, filed on Jan. 30, 2004, the contents of which is incorporated herein by reference.

BACKGROUND OF THE INVENTION

1. Field of the Invention

The present invention relates to a manufacturing method for a strained silicon wafer in which a SiGe layer and a strained Si layer are deposited on a silicon substrate.

2. Description of the Related Art

In these years, a strained silicon wafer in which a SiGe layer is epitaxially grown on a single crystal silicon substrate and a strained Si layer is epitaxially grown on the SiGe layer has been proposed. By using the strained Si layer as a channel area, the strained silicon wafer enables the carrier movement at double or more the speed as fast as using the normal bulk Si wafer.

Therefore, it has been noted that the strained silicon wafer is suitable for the fast MOSFET, MODFET, HEMT and the like.

In the strained silicon wafer having the above described SiGe layer, when the strained Si layer used as the channel area is epitaxially grown, it is required to grow the SiGe layer on the silicon substrate for serving as base material of the epitaxial growth of the strained Si layer.

However, due to a difference in a lattice constant between Si and SiGe, a misfit dislocation occurs when the SiGe layer is epitaxially grown on the silicon substrate. And a threading dislocation caused by the misfit dislocation reaches a surface of the silicon substrate at high density. The same dislocation continuously exists at high density up to the strained Si layer formed on the SiGe layer.

The dislocation in the strained Si layer causes a junction leakage current to be greatly increased when forming the device elements.

Moreover, there is a problem that due to threading dislocations and residual strain energy, an irregularity undulation so called a crosshatch occurs on the surface of the strained Si layer. Therefore, conventionally, various proposals have been made to reduce the threading dislocation density.

For example, in the Japanese Patent Examined Publication No. JP-B-2792785, a method for manufacturing a semiconductor device was disclosed in which a graded SiGe layer having the Ge component increased at a concentration gradient of about 25%/μm or less is epitaxially grown on the single crystal silicon substrate at 850° C. or higher, and then the strained Si layer is epitaxially grown on the graded SiGe layer, a thickness of the strained Si layer being desirably in a range from 100 to 1000 Å.

Also, in Japanese Patent Unexamined Publication No. JP-A-2002-118254, a semiconductor wafer was described in which a step graded SiGe layer of SiGe layer having the Ge composition ratio progressively increased is formed on the silicon substrate. A relaxed SiGe constant composition layer and a strained Si layer having the constant Ge composition ratio are provided on the step graded SiGe layer. The threading dislocation density can be reduced by increasing the number of steps. Then, it is shown that the film thickness of the step graded SiGe layer is 1.5 μm, the film thickness of the relaxed SiGe constant composition layer is ranging from 0.7 to 0.8 μm, and the film thickness of the strained Si layer is ranging from 15 to 22 nm.

Also, in Japanese Patent Unexamined Publication No. JP-A-2003-229360, a semiconductor substrate manufacturing method has been described. That is, after an SiGe layer having a Ge concentration of 22 atomic % or more is deposited on a silicon substrate until the thickness of the SiGe layer becomes about 100 to 500 nm, H+ ions are injected into the SiGe layer, the silicon substrate and the SiGe layer are thermally annealed so as to relax the SiGe layer, and the strained Si layer is deposited on the relaxation SiGe layer until the thickness of the strained Si layer becomes about 5 to 30 nm thick.

Also, in Japanese Patent Unexamined Publication No. JP-A-2003-197544, a semiconductor substrate was disclosed in which the SiGe layer has a film thickness thinner than double of a critical film thickness. The critical film thickness is to cause a lattice relaxation by occurring dislocation due to increased film thickness. The second SiGe layer consists of an SiGe graded SiGe layer having the Ge composition ratio progressively increased toward the surface and an SiGe constant composition layer disposed on the graded SiGe layer with a Ge composition ratio on an upper face of the graded SiGe layer that are deposited alternately and with continuous Ge composition ratio in a state where a plurality of layer are deposited. The Ge composition ratio on a lower face of the second SiGe layer is lower than the maximal value in a layer of Ge composition ratio on the first SiGe layer. Whereby the given thickness of the strained Si layer is formed 20 nm, for example.

However, in the Japanese Patent Examined Publication, the threading dislocation density is in an order of $10^5$ cm$^{-2}$ in an example, and it is not suggested that the thickness of the strained Si layer has any influence in respect to the lower dislocation density.

Similarly, for the semiconductor substrate as disclosed in the Japanese Patent Unexamined Publications Nos. JP-A-2002-118254 and JP-A-2003-229360, the method for relaxing the SiGe layer to reduce the dislocation density was only disclosed, but the relationship between the thickness of the strained Si layer and the reduction in the threading dislocation density was not described.

Moreover, for the semiconductor substrate as disclosed in the Japanese Patent Unexamined Publication No. JP-A-2003-197544, the thickness of the strained Si layer was formed 20 nm as an illustration, but there was no description that its thickness had any influence on reduction in the threading dislocation density.

Thus, as a result of investigations taking notice of the relationship between the strained Si layer and the reduction in the threading dislocation density, the present inventor has found that the dislocation density is reduced in the predetermined thickness of the strained Si layer.

SUMMARY OF THE INVENTION

It is an object of the present invention to provide a manufacturing method fro a strained silicon wafer, in which the strained silicon wafer has an SiGe layer, making it possible to reduce further the threading dislocation density of a strained Si layer formed on the SiGe layer.

According to a first aspect of the present invention, there is provided a method for manufacturing a strained silicon wafer, comprising steps of:

a first step of preparing a single crystal silicon substrate;

a second step of forming a graded SiGe layer on the single crystal silicon substrate under temperature ranging from 800° C. to 1100 C°, the graded SiGe layer having a first Ge composition ratio progressively increased stepwisely from 5 to 60% at atomic ratio;

a third step of forming a SiGe constant composition layer on the graded SiGe layer, the SiGe constant composition layer having a Ge composition ratio substantially equal to the Ge composition ratio on a surface of the-graded SiGe layer which adjacent to the SiGe constant composition layer; and a fourth step of forming a strained Si layer having a thickness of less than 15 nm on the SiGe constant composition layer, wherein the second through fourth steps are performed under the reduced pressure atmosphere while the single crystal silicon substrate is rotated in a circumferential direction at a rate from 300 rpm to 1500 rpm.

If the thickness of the strained Si layer is formed less than 15 nm as described above, the strained silicon wafer with the threading dislocation density greatly reduced is provided.

The Ge composition ratio on the surface of the graded SiGe layer is preferably from 5% at atomic ratio to 60% at atomic ratio.

Further, in this way, if the epitaxial growth is made at a high speed rotation of 300 rpm or more, the threading dislocation is reduced.

When the revolution speed is less than 300 rpm, the threading dislocation is increased to the level of $10^4$ cm$^{-2}$. Also, when the revolution speed is over 1500 rpm, the film thickness is not stable.

According to a second aspect of the present invention as set forth in the first aspect of the present invention, it is preferable that the surface of the single crystal silicon substrate is mirror surface, and has hazes.

If the haze is left on the surface of the single crystal silicon substrate, the strained silicon wafer with the threading dislocation density greatly reduced is provided.

According to a third aspect of the present invention as set forth in the second aspect of the present invention, it is preferable that a surface roughness Rq of the single crystal silicon substrate is 0.20 nm or more and 0.30 nm or less.

DETAILED DESCRIPTION OF THE PREFERRED EMBODIMENTS

The present invention will be described below in detail.

A strained silicon wafer according to the present invention includes a graded SiGe layer having a Ge composition ratio progressively increased stepwise that is formed on a single crystal silicon substrate, a SiGe constant composition layer having a Ge composition ratio almost equivalent to the Ge composition ratio on the surface of the graded SiGe layer that is formed on the graded SiGe layer, and a strained Si layer that is formed on the SiGe constant composition layer, wherein the thickness of the strained Si layer is less than 15 nm, and the threading dislocation density of the strained Si layer is $1 \times 10^3$ cm$^{-2}$ or less.

Since the thickness of the strained Si layer is less than 15 nm as described above, it is possible to suppress the threading dislocation from occurring in forming the strained Si layer on the second SiGe layer, and reduce the threading dislocation density to about 1/10 to 1/100 as compared with the conventional strained silicon wafer.

The graded SiGe layer has a structure in which the Ge composition ratio is progressively increased stepwise, and also comprises an inclined structure.

To manufacture the strained silicon wafer according to the present invention, it is preferred to employ a manufacturing method, characterized by including a first step of preparing a single crystal silicon substrate, and forming a graded SiGe layer having the Ge composition ratio progressively increased stepwise from 5 to 60% at atomic ratio on the single crystal silicon substrate under a temperature atmosphere from 800° C. to 1100° C., a second step of forming an SiGe constant composition layer having the Ge composition ratio almost equivalent to the Ge composition ratio on the surface of the graded SiGe layer and a third step of forming a strained Si layer having a thickness of less than 15 nm on the SiGe constant composition layer.

In another form for manufacturing a strained silicon wafer according to the present invention, a method is characterized by including a first step of preparing a single crystal silicon substrate, and forming a graded SiGe layer having the Ge composition ratio progressively increased stepwise from 5 to 60% at atomic ratio % at atomic ratio on the single crystal silicon substrate under the temperature atmosphere from 800° C. to 1100° C., a second step of forming an SiGe constant composition layer having the Ge composition ratio almost equivalent to the Ge composition ratio on the surface of the graded SiGe layer, and a third step of forming a strained Si layer on the SiGe constant composition layer, wherein the first, second and third steps are performed under the reduced pressure atmosphere while the single crystal silicon substrate is being rotated at a rate from 300 rpm to 1500 rpm in a circumferential direction. If the revolution speed is less than 300 rpm, the threading dislocation is increased up to a level of $10^4$ cm$^{-2}$. Also, if the revolution speed is over 1500 rpm, the formed film thickness is not stable.

It is desirable that the surface of the single crystal silicon substrate is specular, and has haze.

Since the SiGe layer is formed on the surface of the single crystal substrate that is specular and has haze as described above, the threading dislocation is converged without extending to the surface, bringing about the great effect for reducing the threading dislocation on the surface of the strained Si layer.

One of the embodiments of the specific manufacturing method for the strained silicon wafer according to the present invention will be described below.

First of all, a single crystal silicon substrate having the surface specularly polished is prepared. In this case, it is preferable that haze exists on the surface. The haze means a surface condition where the surface color looks differently visually due to wafer surface roughness, when a spot light is applied on the surface of specular wafer under the oblique illumination generally referred to. The haze can be quantitatively evaluated by an optical or non-contact type surface roughness tester or the like. The surface roughness in the case where the haze is left is from 0.20 nm to 0.30 nm in terms of Rq (JIS [Japan Industry Standard] B 0601:2001 the Rq is called Rms previously) within a measurement range of 1 μm$^2$ in the measurement using a non-contact-type AFM (Atomic Force Microscope), for example.

A method for making the surface specular with the haze left may involve the use of the single crystal silicon wafer which is treated up to the secondary polishing without performing the finish polishing in the specular polishing at three series and three stages to be generally performed, for example.

In this way, when the haze exists, that is, when the minute surface roughness is large, the 600° threading dislocation is converged without extending to the surface, bringing about the great effect for reducing the threading dislocation on the surface of the strained Si layer.

Then, the SiGe layer is formed on the surface of the single crystal silicon substrate. A method for forming the SiGe layer in the present invention includes epitaxially growing a stepped first SiGe layer having the Ge composition ratio increased stepwise from 0 to 20% at atomic ratio by changing the Ge concentration, and epitaxially growing a relaxation SiGe layer with the constant Ge composition ratio as a second SiGe layer.

The SiGe layer is formed by epitaxial growth up to a film thickness of about several μm, employing $H_2$ as a carrier gas, and $SiH_4$ and $GeH_4$ as the source gases, for example, in a range of growth temperature from 800° C. to 1100° C.

When the growth temperature is below 800° C., the threading dislocation density is aggravated to an order of $10^5$ $cm^{-2}$. Therefore, it is preferable that the epitaxial growth of the SiGe layer is performed at higher temperatures, thereby reducing the threading dislocation density.

When the growth temperature is over 1100° C., the temperature is near a melting point of the SiGe layer, depending on the Ge concentration contained in the SiGe layer, whereby it is difficult to maintain the crystallinity.

It is more preferable that the growth temperature is from 900° C. to 1100° C.

Also, it is preferable that the growth rate in forming the SiGe layer is 600 nm/min or less.

Then, a strained Si layer is formed on the second SiGe layer formed. It is preferable that the strained Si layer is formed by epitaxial growth, employing $SiH_4$ as the source gas, for example, in a range of 900° C. or less.

It is preferable that the thickness of the strained Si layer is less than 15 nm.

When the thickness is 15 nm or more, the strained Si layer begins to be partially relaxed to give rise to dislocation, due to a difference in the lattice constant between the SiGe layer and Si. Consequently, the threading dislocation density is increased up to the order of $10^4$ $cm^{-2}$.

If the thickness of the strained Si layer is too small, it is difficult to form the device elements. Depending on the uses of the device, the thickness of about 2 nm at minimum is required generally to form the channel layer.

Accordingly, from the viewpoint of producing the device elements, it is preferable that the thickness of the strained Si layer is from 2 nm to less than 15 nm, and more preferable that the thickness is from 5 nm to less than 10 nm.

The silicon wafer having the strained Si layer formed at low threading dislocation density is employed as the suitable substrate for forming the fast devices, because the carrier movement is made faster on the strained Si layer.

EMBODIMENT EXAMPLES

The present invention will be described in more detail by way of example, but the present invention is not limited to the following examples.

EMBODIMENT EXAMPLES 1 to 6

A SiGe layer was epitaxially grown on the surface of a single crystal silicon substrate, which was specularly polished and had haze as visually observed. At this time, as a graded SiGe layer, a layer having the Ge composition increased stepwise from 0 to 20% at atomic ratio with 10 steps and having a thickness of 2 μm was formed, and then as the SiGe layer, a relaxation SiGe layer having the constant Ge composition ratio of 20% at atomic ratio and a thickness of 1 μm was formed.

In epitaxial growth of the graded SiGe layer and the relaxation SiGe layer, $H_2$ was employed as a carrier gas, and $SiH_4$ and $GeH_4$ were employed as the source gases. Also, the growth temperature of the graded SiGe layer and the relaxation SiGe layer was 900° C. and the growth rate was 80 nm/min.

And a strained Si layer was epitaxially grown on the relaxation SiGe layer at 800° C., employing $SiH_4$ as the source gas, by changing the thickness of the strained Si layer as shown in the embodiment examples 1 to 6 of Table 1, producing a strained Si wafer.

The graded SiGe layer, the relaxation SiGe layer and the strained Si later were formed under the reduced pressure atmosphere of 15 Torr in a single wafer epitaxial apparatus while the single crystal silicon substrate was being rotated at a rate of 900 rpm in the circumferential direction.

The obtained strained silicon wafer was selectively etched 100 nm thick from the surface thereof in Secco solution (HF: $K_2Cr_2O_7$=2:1), and the number of pits after etching was counted by observing the etching face at a magnification of 500 using a differential interference microscope, whereby the threading dislocation density was evaluated.

The results are listed in Table 1.

Comparative Examples 1 and 2

A strained silicon wafer was produced in the same way as in the embodiment examples 1 to 6, except that the thickness of a strained Si layer was given as shown in the Comparative Examples 1 and 2 of Table 1, whereby the threading dislocation density was evaluated.

The results are listed in Table 1.

TABLE 1

|  | Thickness of strained Si layer (nm) | Threading dislocation density ($cm^{-2}$) |
| --- | --- | --- |
| Embodiment Example 1 | 3.7 | $5.5 \times 10^2$ |
| Embodiment Example 2 | 7.5 | $5.8 \times 10^2$ |
| Embodiment Example 3 | 8.7 | $6.3 \times 10^2$ |
| Embodiment Example 4 | 10.0 | $7.1 \times 10^2$ |
| Embodiment Example 5 | 12.6 | $8.7 \times 10^2$ |
| Embodiment Example 6 | 14.7 | $9.0 \times 10^2$ |
| Comparative Example 1 | 17.0 | $5.6 \times 10^4$ |
| Comparative Example 2 | 20.0 | $4.5 \times 10^4$ |

It was conformed that if the thickness of the strained Si layer is less than 15 nm (examples 1 to 6), the threading dislocation density on the surface of the strained Si layer is $10^3$ $cm^{-2}$ or less, whereas if the thickness is 15 nm or more (Comparative Examples 1 and 2), the threading dislocation density is increased up to the order of $10^4$ $cm^{-2}$, as shown in Table 1.

It is considered that the increased threading dislocation density caused by increased thickness of the strained Si layer occurs because the strained Si layer begins to be partial relaxed due to a difference in the lattice constant between SiGe and Si.

Comparative Example 3

The first and second SiGe layers were epitaxially grown on the surface of a single crystal silicon substrate, which was specularly polished and had haze removed, in the same way as in the embodiment examples.

Then, the strained Si layer was formed 10 nm thick on the second SiGe layer under the same conditions as in the embodiment examples. The threading dislocation density was evaluated for the produced strained silicon wafer, and consequently it was $3.5 \times 10^3$ cm$^{-2}$.

Comparing with the embodiment example 4 in which the thickness of strained Si layer is the same, it was confirmed that the threading dislocation density was apparently increased, bringing about the effect for reducing the threading dislocation due to residual haze on the surface.

EMBODIMENT EXAMPLES 7 to 9

A graded SiGe layer, a relaxation SiGe layer and a strained Si layer were formed by epitaxial growth under the condition where the revolution speed was used as shown in the embodiment examples 7 to 9 of Table 2. At this time, the thickness of the formed strained Si layer was 5 nm. The strained silicon wafer was produced in the same way as in the embodiment examples 1 to 6, except for the revolution speed, whereby the threading dislocation density was evaluated.

Comparative Example 4

A graded SiGe layer, a relaxation SiGe layer and a strained Si layer were formed by epitaxial growth under the condition where the revolution speed was used as shown in the Comparative Example 4 of Table 2. At this time, the thickness of the formed strained Si layer was 10 nm. The strained silicon wafer was produced in the same way as in the embodiment examples 7 to 9, except for the revolution speed, whereby the threading dislocation density was evaluated.

TABLE 2

|  | Revolution speed (rpm) | Threading dislocation density (cm$^{-2}$) |
| --- | --- | --- |
| Embodiment Example 7 | 300 | $4.2 \times 10^2$ |
| Embodiment Example 8 | 600 | $5.3 \times 10^2$ |
| Embodiment Example 9 | 900 | $6.3 \times 10^2$ |
| Embodiment Example 10 | 1500 | $6.8 \times 10^2$ |
| Comparative Example 4 | 50 | $4.7 \times 10^4$ |

It was conformed that if the revolution speed is 300 rpm or more (examples 7 to 9), the threading dislocation density on the surface of the strained Si layer is $10^3$ cm$^{-2}$ or less, whereas if the revolution speed is 50 rpm (Comparative Example 4), the threading dislocation density is increased up to the order of $10^4$ cm$^{-2}$, as shown in Table 2.

In this way, if the revolution speed is 300 rpm or more in forming the graded SiGe layer, the relaxation SiGe layer and the strained Si layer, the threading dislocation density within the SiGe layer can be reduced.

With the present invention, the strained silicon wafer with the threading dislocation density more greatly reduced is provided as described above.

In this way, since the strained silicon wafer according to the present invention is formed with the high quality strained Si layer with low threading dislocation density, the strained Si layer is employed as the channel area to make the carrier movement faster, contributing to higher microstructure, performance and so on than the semiconductor device. Thereby, the strained silicon wafer is suitably employed for the fast MOSFET, MODFET and HEMT.

Also, with the manufacturing method according to this invention, the strained silicon wafer according to the present invention is easily obtained.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

What is claimed is:

1. A method for manufacturing a strained silicon wafer, comprising:
    a first step of preparing a single crystal silicon substrate;
    a second step of forming a graded SiGe layer on the single crystal silicon substrate under temperature ranging from 800° C. to 1100° C., the graded SiGe layer comprising a first Ge composition ratio progressively increased stepwisely from 5 to 60% atomic ratio;
    a third step of forming a SiGe constant composition layer on the graded SiGe layer, the SiGe constant composition layer comprising a Ge composition ratio substantially equal to Ge composition ratio a surface of the graded SiGe layer which is adjacent to the SiGe constant composition layer; and
    a fourth step of forming a strained Si layer comprising a thickness less than 15 nm on the SiGe constant composition layer,
    wherein the second through fourth steps are performed under reduced pressure atmosphere while the single crystal silicon substrate is rotated in a circumferential direction at a rate of 300 rpm to 1500 rpm.

2. The method for manufacturing the strained silicon wafer as set forth in claim 1, wherein the surface of the single crystal silicon substrate is a mirror surface, and has hazes.

3. The method for manufacturing the strained silicon wafer as set forth in claim 2, wherein the single crystal silicon substrate comprises a surface roughness Rq of at least 0.20 nm and not more than 0.30 nm.

4. The method for manufacturing the strained silicon wafer as set forth in claim 1, wherein the strained Si layer comprises a threading dislocation density of $1 \times 10^3$ cm$^{-2}$ or less.

5. The method for manufacturing the strained silicon wafer as set forth in claim 1, wherein the third step comprises epitaxially growing a SiGe constant composition layer on the graded SiGe layer.

6. A method for manufacturing a strained silicon wafer a threading dislocation density of $1 \times 10^3$ cm$^{-2}$ or less, consisting essentially of:
    (a) preparing a single crystal silicon substrate;
    (b) forming a graded SiGe layer on the single crystal silicon substrate at a temperature ranging from 800° C. to 1100° C., the graded SiGe layer comprising a first Ge composition ratio progressively increased stepwisely from 5 to 60% atomic ratio;
    (c) forming a SiGe constant composition layer on the graded SiGe layer, the SiGe constant composition layer comprising a Ge composition ratio substantially equal to a Ge composition ratio at a surface of the graded SiGe layer which is adjacent to the SiGe constant composition layer; and
    (d) forming a strained Si layer comprising a thickness less than 15 nm on the SiGe constant composition layer,
    wherein (b) through (d) are performed at a temperature ranging from 800° C. to 1100° C. and under a reduced pressure atmosphere while the single crystal silicon substrate is rotated in a circumferential direction at a rate of 300 rpm to 1500 rpm.

* * * * *